(12) United States Patent
Gurvich et al.

(10) Patent No.: US 7,038,540 B2
(45) Date of Patent: May 2, 2006

(54) ENHANCED EFFICIENCY FEED FORWARD POWER AMPLIFIER UTILIZING REDUCED CANCELLATION BANDWIDTH AND SMALL ERROR AMPLIFIER

(75) Inventors: Mark Gurvich, Costa Mesa, CA (US); Bill Vassilakis, Orange, CA (US); Ezmarai Arbab, Laguna Niguel, CA (US); Alexander Rabinovich, Cypress, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 10/775,799

(22) Filed: Feb. 10, 2004

(65) Prior Publication Data

US 2004/0160274 A1    Aug. 19, 2004

Related U.S. Application Data

(60) Provisional application No. 60/447,772, filed on Feb. 14, 2003.

(51) Int. Cl.
H03F 1/00       (2006.01)
H03F 1/26       (2006.01)
(52) U.S. Cl. ...................................... 330/151; 330/149
(58) Field of Classification Search ................ 330/149, 330/500, 151, 3
See application file for complete search history.

(56) References Cited

U.S. PATENT DOCUMENTS

| | | | |
|---|---|---|---|
| 4,885,551 A | | 12/1989 | Myer ........................ 330/52 |
| 5,422,595 A | | 6/1995 | Lott .......................... 330/2 |
| 5,489,875 A | | 2/1996 | Cavers ...................... 330/151 |
| 5,977,825 A | * | 11/1999 | Mueck ....................... 330/151 |
| 6,094,096 A | * | 7/2000 | Myer .......................... 330/52 |
| 6,118,339 A | | 9/2000 | Gentzler et al. ............ 330/149 |
| 6,133,791 A | * | 10/2000 | Horiguchi et al. .......... 330/151 |
| 6,140,874 A | * | 10/2000 | French et al. ............... 330/151 |

(Continued)

Primary Examiner—Khanh V. Nguyen
(74) Attorney, Agent, or Firm—Myers Dawes Andras & Sherman, LLP.

(57) ABSTRACT

A feed forward power amplifier is disclosed which utilizes three signal cancellation loops. Loop 1 includes a main amplifier and is used to derive a carrier cancelled sample of the main amplifier output. Loop 2 includes an error amplifier used to amplify the carrier cancelled signal derived from Loop 1 operation in order to cancel distortion products generated due to the nonlinear nature of the main amplifier. Loop 2 also utilizes a very short Loop 2 delay line. A significant efficiency gain is provided due to reduced output power losses associated with the Loop 2 delay line. Lower output losses also results in lower distortion levels produced by the main amplifier. This, in turn, reduces the size and performance requirements placed on the error amplifier. A smaller and more efficient error amplifier is employed resulting in further amplifier system efficiency improvement. A spurious signal detector for out-of-band distortion detection and an associated microcontroller for Loop 1 and Loop 2 control are also provided. A third signal cancellation loop is utilized to sample the amplifier output and reduce the carrier level of the signals sampled at the output of the amplifier before providing the sampled output to the spurious signal detector. By significantly reducing the carrier power level relative to distortion power levels a cost effective spurious signal detector can be utilized. This also provides a faster conversion time in Loop 2 cancellation and enhanced cancellation of out-of-band distortion products due to a greater useful dynamic range available for the DSP employed in the spurious signal detector.

34 Claims, 12 Drawing Sheets

U.S. PATENT DOCUMENTS

| | | |
|---|---|---|
| 6,144,255 A | 11/2000 | Patel et al. .................. 330/151 |
| 6,147,555 A | 11/2000 | Posner et al. ................ 330/149 |
| 6,211,733 B1 | 4/2001 | Gentzler ...................... 330/149 |
| 6,259,320 B1 | 7/2001 | Valk et al. ................... 330/149 |
| 6,275,106 B1 * | 8/2001 | Gomez ......................... 330/151 |
| 6,342,810 B1 | 1/2002 | Wright et al. ................. 330/51 |
| 6,359,508 B1 * | 3/2002 | Mucenieks .................... 330/149 |
| 6,456,160 B1 * | 9/2002 | Nakayama et al. ............ 330/52 |
| 6,573,793 B1 | 6/2003 | Gutierrez ..................... 330/151 |
| 6,603,359 B1 | 8/2003 | Fujiwara et al. .............. 330/310 |
| 2001/0015673 A1 | 8/2001 | Yamashita et al. ........... 330/151 |
| 2003/0064738 A1 | 4/2003 | Posner et al. ................. 455/503 |

* cited by examiner

ENHANCED EFFICIENCY FEED FORWARD POWER AMPLIFIER UTILIZING REDUCED CANCELLATION BANDWIDTH AND SMALL ERROR AMPLIFIER

RELATED APPLICATION INFORMATION

The present application claims the benefit under 35 USC 119(e) of U.S. provisional application Ser. No. 60/447,772 filed Feb. 14, 2003, the disclosure of which is incorporated herein by reference in its entirety.

BACKGROUND OF THE INVENTION

1. Field of the Invention

The present invention relates to RF power amplifiers and methods of amplifying an RF signal. More particularly, the present invention relates to feed forward amplifiers and related methods.

2. Description of the Prior Art and Related Information

Linear RF power amplifiers are designed to amplify incident RF signals without adding unwanted distortion products, producing output signals at significantly higher output levels. As is known in the art, amplifiers have a wide variety of applications. Amplifiers can be biased to operate in one of a number of so-called Classes. When biased to operate in Class A, the amplifier provides a linear relationship between input voltage and output voltage. While operation in. Class A has a wide range of applications, when higher power output and efficiency are required or desired, the amplifier is sometimes biased to operate in Class A/B. When biased to operate in Class A/B, however, the Class A/B amplifier power transfer curve 25 is less linear than for Class A amplifiers, illustrated in FIG. 1 by trace 15. To increase efficiency, communication systems often operate amplifiers in the non-linear region 25. This practice, however, does introduce amplitude and phase distortion components into the output signal produced by the amplifier.

As is also known in the art, most communication systems have government allocated frequency bandwidths 18 (that is, in-band frequencies) centered about a carrier frequency $F_c$ as shown in FIG. 2. For example, a CDMA (Code Division Multiple Access) IS-95 communication system signal has a predefined bandwidth of 1.25 MHz. Different CDMA communication channels are allocated different bands of the frequency spectrum. Amplifiers are used in such systems, and are frequently biased to operate in Class A/B. Referring to FIG. 1, signal processing such as amplification by an amplifier operating in the non-linear region 25 can produce distortion frequency "shoulders" 22a–22b outside a signal's allocated bandwidth 18 (FIG. 3). (These are called out-of-band frequencies.) These distortion frequency components 22a–22b can interfere with bandwidths allocated to other communication signals. Thus, regulatory bodies around the world impose strict limitations on out-of-band frequency components.

Many techniques exist to reduce out-of-band distortion. One such technique is shown in FIG. 4 where a predistortion unit 24 is fed by a signal 22 to be amplified. The predistortion unit 24 has a power transfer characteristic 23 (FIG. 1) and compensates for distortion introduced by subsequent amplification in Class A/B amplifier 26. More particularly, the predistortion unit 24 transforms electrical characteristics (for example, gain and phase) of the input signal such that subsequent amplification provides linear amplification to the phase and frequency characteristics of the input signal. In one embodiment, compensation is effected by changing bias parameters of the predistortion amplifier or the main Class A/B amplifier. One method is described in U.S. Pat. No. 6,046,635 titled DYNAMIC PREDISTORTION COMPENSATION FOR A POWER AMPLIFIER, the contents of which are incorporated herein, in their entirety, by reference. The predistortion unit 24 is configured with a priori measurements of the non-linear characteristics of the Class A/B amplifier. Unfortunately, the amplifier characteristics (amplification curve 10 with region 25 in FIG. 1) change over time and temperature making effective predistortion more difficult. For example, as the temperature of the amplifier increases, its non-linear region 25 may become more or less linear, requiring a compensating change in the transform performed by a predistortion unit 24. As shown in FIG. 6, some adaptive predistortion systems use a control system 30 to alter predistorter characteristics based on environmental factors such as temperature. Typically the control system employs a look-up table with predetermined predistorter control settings for use in predetermined situations. However, environmental factors alone do not determine the alterations in an amplifier's characteristics. Thus, over time, amplifier characteristics vary unpredictably due to aging of amplifier components.

Another approach to reduce amplifier distortion is to use feed forward compensation, as shown in FIG. 5. Here, a feed forward network 100 is included for reducing out-of-band distortion. The feed forward amplifier includes a differencing network or combiner 25, a main amplifier 20 operating as a Class A/B amplifier, an error amplifier 35, delay circuits 15 and 30, and a combiner 40. The differencing network 25 produces an output signal representative of the difference between a portion of the amplified signal output from the main amplifier 20 operated in Class A/B and the signal fed to the amplifier 20 prior to such amplification. The frequency components in the differencing network 25 output signals are, therefore, the out-of-band frequency components 22a–22b introduced by the main amplifier 20 as illustrated in FIG. 5. The output produced by the differencing network 25 is amplified by error amplifier 35 to produce an out-of-band correcting signal. The combiner 40 combines the correcting signal produced by differencing network 25 and error amplifier 35, 180 degrees out of phase with the delayed signal (delayed by delay 30) output of the main amplifier 20 thus reducing the energy in the out-of-band frequencies 22a–22b of the signal output by the main amplifier 20. Fe includes delay line 30 to compensate for the delay in error amplifier 35. It should be noted that minute differences in timing between these elements can impair the effectiveness of a feed forward system. While a manufacturer can carefully match components prior to shipment, as feed forward components age, the correcting signal and processed signal can become mistimed if not properly compensated. This will limit the ability to cancel the out-of-band distortion. Another problem associated with the delay line 30 is that significant output power losses occur for delays which are long enough to match that of the error amplifier path. These losses are highly undesirable.

Accordingly, a need presently exists for a system and method for amplifying RF signals while minimizing power losses and minimizing out-of-band distortion.

SUMMARY OF THE INVENTION

In a first aspect the present invention provides a feed forward amplifier, comprising an input for receiving an RF signal and a main amplifier receiving and amplifying the RF signal. The feed forward amplifier further comprises a main amplifier output sampling coupler, a first delay coupled to the input and providing a delayed RF signal, and a carrier cancellation combiner coupling the delayed RF signal from the first delay to the sampled output from the main amplifier. The feed forward amplifier further comprises an error amplifier which receives and amplifies the output of the carrier cancellation combiner, a second delay coupled to the output of the main amplifier and an error coupler which combines the output from the error amplifier and the delayed main amplifier output from the second delay so as to cancel distortion introduced by the main amplifier. An output sampling coupler is coupled to the error coupler output and provides a sampled output signal. The feed forward amplifier further comprises a carrier signal reduction circuit coupled to the output sampling coupler which provides a sampled output signal with a reduced carrier component, and a spurious signal detector coupled to the carrier signal reduction circuit, comprising a variable frequency down converter, for detecting out of band distortion in the reduced carrier sampled output signal.

In a preferred embodiment the feed forward amplifier may further comprise a controller, coupled to the spurious signal detector, for controlling the feed forward amplifier system to minimize distortion detected by the spurious signal detector. The feed forward amplifier may also further comprise a gain adjuster and phase adjuster coupled between the carrier cancellation combiner and the error amplifier. The controller controls the gain adjuster and phase adjuster to minimize the distortion detected by the spurious signal detector. The feed forward amplifier may also further comprise a gain adjuster and phase adjuster coupled between the input and the main amplifier. The controller controls the gain adjuster and phase adjuster to minimize the output signal from the carrier cancellation combiner. The feed forward amplifier may also further comprise a predistorter coupled between the input and the main amplifier. The controller controls the predistorter to minimize the distortion detected by the spurious signal detector. The carrier signal reduction circuit preferably comprises an input sampling coupler configured between the first delay and the carrier cancellation combiner for sampling the input RF signal and a second carrier cancellation combiner for combining the sampled output signal and the sampled input signal to cancel a carrier component in the sampled output signal. The carrier signal reduction circuit preferably further comprises an input delay between the input sampling coupler and the second carrier cancellation combiner and an output delay between the output sampling coupler and the second carrier cancellation combiner. The carrier signal reduction circuit may further comprise a gain adjuster and phase adjuster coupled between the output sampling coupler and the second carrier cancellation combiner, and the controller controls the gain and phase adjuster to minimize the carrier component of the sampled output signal. Preferably, the second delay is substantially less than the delay of the signal path through the error amplifier. Also, the error amplifier is preferably substantially smaller than the main amplifier. For example, the error amplifier may be about one tenth the size of the main amplifier. The reduced carrier sampled output signal provided by the carrier signal reduction circuit preferably has a carrier component about 15–20 dB less than the sampled output signal provided by the output sampling coupler. The variable frequency down converter preferably comprises a variable frequency signal generator controlled by the controller and a mixer, coupled to receive the variable frequency signal and the sampled output signal, for converting the frequency of the carrier reduced sampled output signal to a lower frequency signal. The spurious signal detector preferably further comprises a bandpass filter coupled to the output of the down converter and a digital signal processor coupled to the output of the bandpass filter. The spurious signal detector also further comprises an analog to digital converter coupled between the bandpass filter and the digital signal processor.

According to another aspect the present invention provides a delay mismatched feed forward amplifier comprising an input for receiving an RF input signal and a first control loop coupled to the input. The first control loop comprises a main amplifier, a main amplifier output sampling coupler, a delay element, and a first carrier cancellation combiner. The feed forward amplifier further comprises a second control loop, coupled to the first control loop, comprising a first signal path receiving the output of the main amplifier and a second signal path comprising an error amplifier receiving the output of the first carrier cancellation combiner. An error injection coupler couples the first and second signal paths. The first and second signal paths have a delay mismatch with the first signal path having substantially less delay than the second signal path. The feed forward amplifier further comprises an output coupled to the error injection coupler and a third control loop coupled between the input and the output. The third control loop comprises a first coupler for sampling the input, a second coupler for sampling the output, and a second carrier cancellation combiner. The feed forward amplifier further comprises a distortion detector coupled to the output of the second carrier cancellation combiner and a controller, coupled to the distortion detector, for controlling at least one of the first and second control loops to minimize distortion detected by the distortion detector.

In a preferred embodiment the delay mismatch between the first and second signal paths is greater than 3 cycles of the RF input signal. For example, the delay of the second signal path may be about 10–20 ns. and the delay of the first signal path may be less than about 3 ns. More specifically, the delay of the second path may be about 10 ns. and the delay of the first signal path may be about 1.0–1.5 ns. More generally, the delay of the first signal path is preferably about 30 percent or less of the delay of the second signal path. The third control loop preferably further comprises a delay means for providing a signal delay equalization of the sampled input signal and the sampled output signal and gain and phase adjusting means for providing an amplitude equalization of the sampled output signal and the sampled input signal and an anti-phase addition of the sampled output signal and the sampled input signal at the second carrier cancellation combiner. The controller controls the gain and phase adjusting means to minimize the level of carrier components in the signal output from the second carrier cancellation combiner. Preferably, the error amplifier is substantially smaller than the main amplifier. For example, the error amplifier may be about one tenth the size of the main amplifier. The input signal preferably has a carrier bandwidth of about 5 MHz or less. The output of the second carrier cancellation combiner preferably has a substantially lower power carrier component than the output signal sampled by the second coupler. For example, the output of the second carrier cancellation combiner may have about 15–20 dB less power than the output signal sampled by the second coupler.

According to another aspect the present invention provides a method for controlling an amplifier system. The amplifier system has an input for receiving an input signal having a carrier and a control loop comprising a control loop input, a first signal path, a second signal path, and a control loop output, at least one of the first and second signal paths including an amplifier. The method comprises sampling a signal at the control loop output, sampling the input signal, and combining the sampled input signal and sampled output signal to provide a combined signal with a reduced carrier component. The method further comprises setting a variable frequency generator to a first frequency, down converting the combined signal using the first frequency, and measuring the energy of the down converted signal. The method further comprises adjusting the frequency of the variable frequency generator, detecting distortion using the measured energy at different down converted frequencies and controlling the amplifier system using the detected distortion.

In a preferred embodiment of the method for controlling an amplifier system the act of detecting distortion comprises detecting the carrier signal frequency band by measuring energy at different down conversion frequencies and detecting out-of-band distortion by measuring power outside of the carrier signal frequency band. Controlling the amplifier preferably comprises controlling the signal characteristics of at least one of the first and second signal paths to minimize the detected distortion. The method may further comprise adjusting the amplitude of at least one of the sampled output signal and sampled input signal, adjusting the phase of at least one of the sampled input signal and sampled output signal, and iteratively repeating the adjusting of amplitude and phase until the energy measured at the down converted frequency is less than a desired intermediate frequency threshold level. In a preferred embodiment the threshold level is about 15–20 dB below the level of the sampled output signal prior to carrier cancellation.

According to another aspect the present invention provides a method for amplifying an RF input signal employing feed forward compensation. The method comprises receiving an RF input signal and providing the signal on a main signal path, amplifying the signal on the main signal path employing a main amplifier, and sampling the main amplifier output. The method further comprises sampling the RF input signal and providing the sampled RF input signal on a second signal path, delaying the sampled RF input signal on the second signal path, and coupling the delayed RF input signal to the sampled output from the main amplifier so as to cancel at least a portion of a carrier component of the sampled output from the main amplifier and provide a carrier canceled signal having a distortion component. The method further comprises amplifying the carrier canceled signal employing an error amplifier to provide an error signal, delaying the output of the main amplifier by a delay substantially less than the signal delay through the error amplifier, and combining the error signal and the delayed output of the main amplifier so as to cancel distortion introduced by the main amplifier and provide an amplified RF output. The method further comprises sampling the amplified RF output, combining the sampled amplified RF output with an anti-phase sample of the input signal to provide a carrier reduced sampled output, down converting the carrier reduced sampled output using a variable frequency down converting signal and detecting out-of-band distortion using the down converted signal.

In a preferred embodiment the method further comprises adjusting the gain and phase of the signal input to the error amplifier to minimize the detected out-of-band distortion. The method may also further comprise adjusting the gain and phase of at least one of the sampled amplified RF output and sampled input signal to reduce the carrier component of the down converted signal to a desired level. The signal delay through the error amplifier is preferably greater than the signal delay of the output of the main amplifier by at least 3 cycles of the RF input signal. For example, the signal delay through the error amplifier may be about 10–20 ns. and the signal delay of the output of the main amplifier is less than about 3 ns. More specifically, the signal delay through the error amplifier may be about 10 ns. and the signal delay of the output of the main amplifier is preferably less than about 1.5 ns. More generally, the signal delay of the output of the main amplifier is preferably less than about 30 percent of the signal delay through the error amplifier. Also, the input signal preferably has a carrier bandwidth of about 5 MHz or less.

Further aspects of the present invention are set out in the following detailed description.

DETAILED DESCRIPTION OF THE INVENTION

Figure 7:
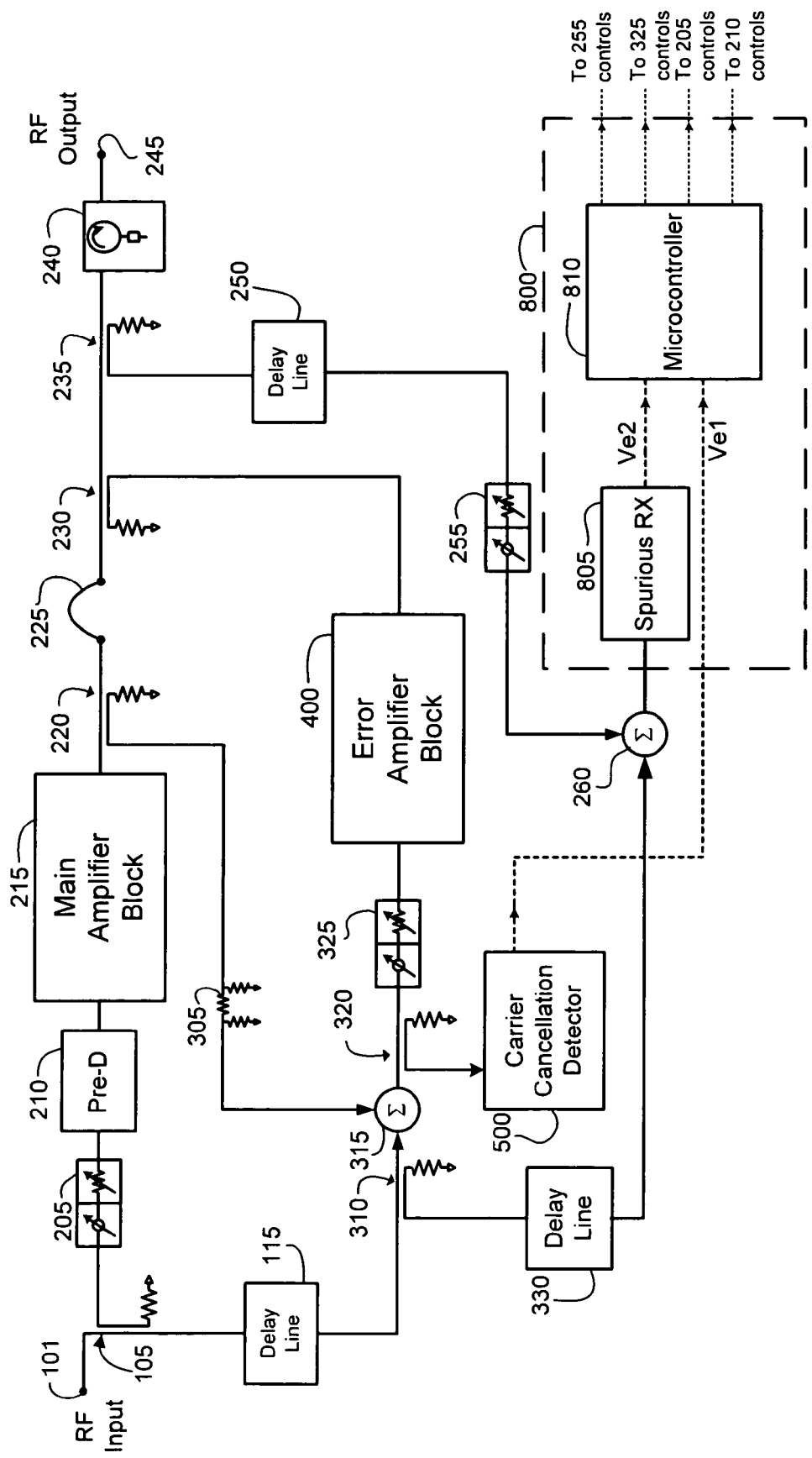
FIG. 7 is a block schematic drawing of a feed forward amplifier system in accordance with a preferred embodiment of the present invention.

The present invention is generally directed to feed forward power amplifiers used for amplification of RF signals and a preferred embodiment is shown in FIG. 7. Various aspects of the invention may be utilized in other amplifier architectures and implementations, however, and the preferred embodiment described below is purely illustrative in nature.

First, referring to FIG. 7 the general architecture and principles of operation of the present invention will be described. In the illustrated preferred embodiment a feed forward power amplifier is disclosed which utilizes three signal cancellation loops. Loop 1 comprises main amplifier block (or module) 215 and associated couplers and interconnections and is used to derive a carrier cancelled signal at the first summing junction or (carrier cancellation combiner) 315. Loop 2 comprises error amplifier block (or module) 400 and associated couplers and interconnections. Loop 2 is used to amplify the carrier cancelled signal derived from Loop 1 operation in order to cancel IMD (Inter Modulation Distortion) products generated due to nonlinear operation of the main amplifier block 215. Loop 2 also utilizes a very short Loop 2 delay line 225. The nominal length of a Loop 2 delay line in a conventionally designed feed forward amplifier is determined by the electrical length of the error amplifier module and associated couplers and interconnections in order to achieve maximum cancellation bandwidth. A typical Loop 2 delay line, or in some implementations delay filter, can have an electrical delay on the order of 13 to 20 ns (nanoseconds). In practical implementations such a delay line, or a delay filter, contributes to a significant increase in power losses in the output of the main amplifier block 215. These power losses are highly undesirable and should be minimized whenever possible.

In order to address these power losses a very short delay line 225 is implemented in the present invention introducing an intentional delay mismatch between the two signal paths of Loop 2. Implementation of a short delay line 225 results in a narrow IMD cancellation bandwidth, when compared to a more conventional design. However, IMD cancellation performance achievable by the present invention is comparable against a conventionally designed feed forward power amplifier when used with narrow bandwidth RF signals, e.g., about 5 MHz or less. One advantage offered by the disclosed feed forward power amplifier architecture is a significant efficiency gain due in part to reduced output power losses associated with a short Loop 2 delay line 225. Lower output power losses allows a smaller main amplifier module 215 for given output signal level requirements. One additional benefit of reduced losses in the output of a main amplifier module 215 is manifested in lower IMD levels produced by main amplifier module 215. This, in turn, reduces size and performance requirements placed on error amplifier module 400. Thus, a smaller and more efficient error amplifier can be implemented resulting in overall feed forward power amplifier system efficiency improvement.

Loop 3 comprises a second carrier cancellation combiner 260 coupled to the input and output of the feed forward amplifier. A control system 800 is coupled to the output of the second carrier cancellation combiner. The configuration of Loop 3 and control system 800 enhances and simplifies operation of the feed forward power amplifier. Conventionally designed feed forward power amplifier systems typically utilize pilot carrier control methods in order to continuously adjust and maintain cancellation of the error amplifier loop. In another approach described in U.S. Pat. No. 6,140,874 to French et al., incorporated herein by reference in its entirety, a spurious signal detection method is used to control IMD cancellation action of Loop 2. In the present invention an enhancement to this technique is disclosed. The third signal cancellation loop—Loop 3 is utilized to reduce the carrier level of the signals present at the sample port 235 at the output of the amplifier. This reduced carrier signal is provided to a spurious signal detector (or receiver) 805, within control system 800. The spurious signal detector employs a variable frequency down converter and a DSP (Digital Signal Processor) to isolate the out-of-band IMDs from the carrier bandwidth. By significantly reducing carrier level relative to IMD levels a substantially simpler spurious signal detector can be utilized. This aspect of the present invention also allows for a faster conversion time in Loop 2 cancellation and enhanced cancellation of IMD products due to a greater useful dynamic range available for the DSP employed in the spurious signal detector.

Figure 14:
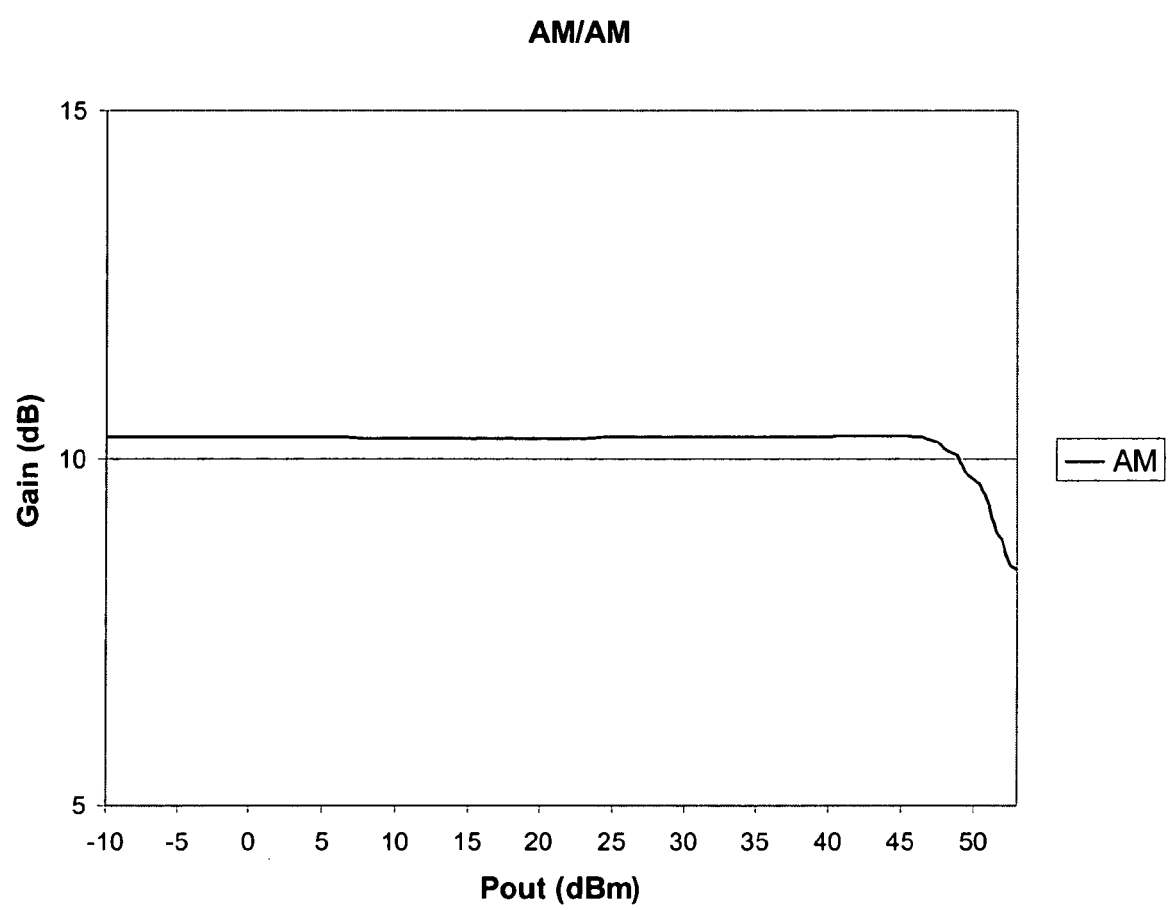
FIG. 14 is a drawing of an AM/AM curve for a class A/B amplifier.
Figure 15:
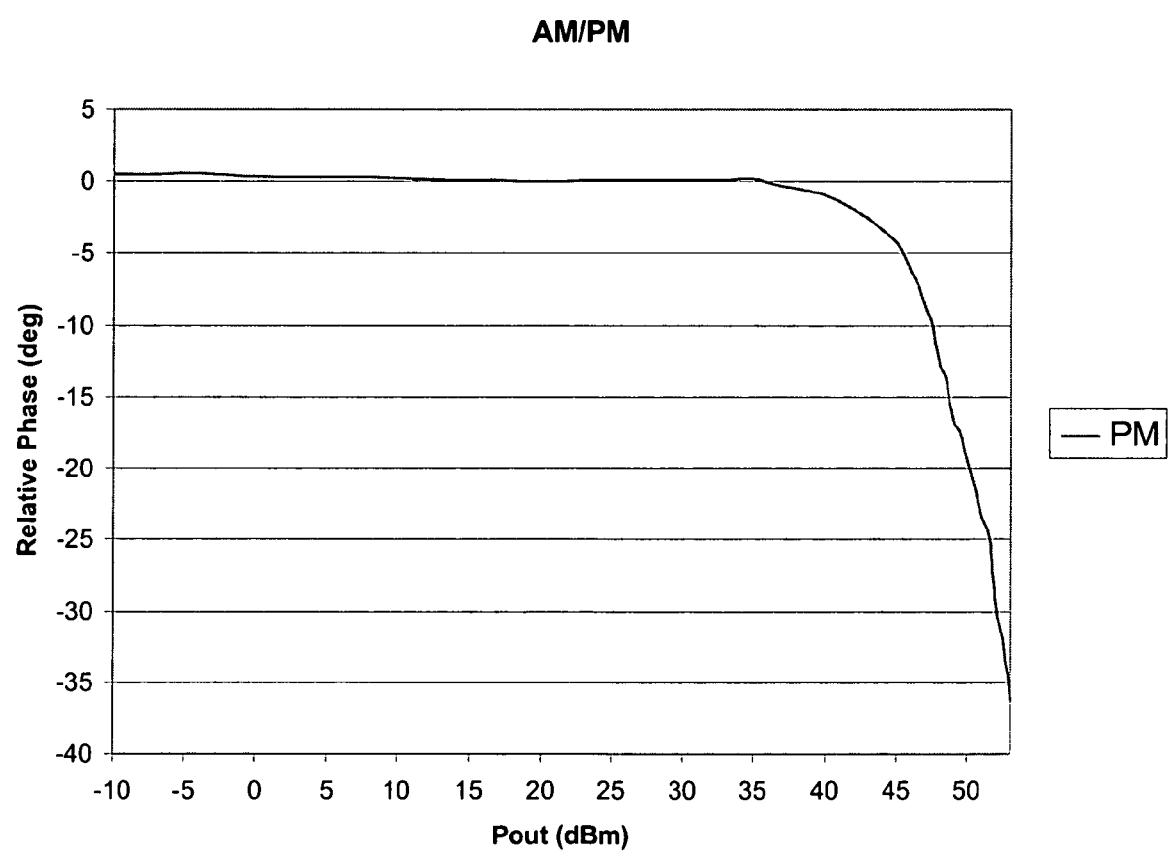
FIG. 15 is a drawing of an AM/PM curve for a class A/B amplifier.

Next the specific construction and operation of the preferred embodiment of the invention shown in FIG. 7 will be described. As shown in FIG. 7, RF signal(s) are applied to the input port 101 of the feed forward power amplifier. A coupled portion of the input signal is delivered via first conventionally disposed directional coupler 105 to the input of the first gain and phase shifting network 205. It is apparent to those skilled in the art that gain and phase shifting networks can be implemented using various circuits and components. For example, a voltage variable attenuator (WA) and a variable phase adjuster may be employed to provide the desired controllable gain and phase adjustments. The output of the first gain and phase shifting network 205 is coupled to the input of the predistortion circuit 210. Predistortion circuit 210 is used to compensate non-linear behavior of AM/AM (FIG. 14) and AM/PM (FIG. 15) characteristics of the class A/B biased main amplifier 215. The output of the predistortion circuit 210 is coupled to the input of main amplifier 215. Main amplifier 215 may comprise one or more amplifier devices, such as LDMOS amplifiers, biased in a high efficiency class such as class A/B. For high power RF applications typically plural amplifier devices or stages will be employed configured in a module. The output of the main amplifier 215 is connected to the input port of the second conventionally disposed main amplifier output sampling coupler 220. The coupling factor of sampling coupler 220 is dependent on many factors inherent to feed forward power amplifier design, but typically a 20 to 30 dB coupling value may be used as in conventional designs. The output port of coupler 220 is connected to the input of delay line 225. Delay line 225 is used to delay amplified signals from the output of the main amplifier 215. Those skilled in the art can appreciate that delay line 225 can implemented in a number of ways. For example, in high power applications where low insertion loss is critical, the delay line can implemented using a low insertion, large diameter coaxial cable or by a delay filter with desired electrical characteristics. In the case of low power applications where increased insertion losses are not as critical to system performance a smaller diameter coaxial cable or lumped circuit elements can be used in order to achieve desired electrical delay. Specific delay characteristics of delay line 225 will discussed below. The output port of the delay line 225 is connected to the input port of the error injection coupler (or error coupler) 230. The output port of the error injection coupler 230 is connected to the input port of the output sampling coupler 235. The output port of the coupler 235 is connected to port 1 of the output isolator 240. Port 2 of the output isolator 240 is connected to the output connector 245 of the amplifier system. The output port of the first directional coupler 105 is connected to the input port of the first delay line 115. The output port of the first delay line 115 is connected to the input port of the third directional coupler 310. Coupler 310 samples the input signal and provides it to Loop 3, described below. The output port of the coupler 310 is connected to the first port of the summing junction (carrier cancellation combiner) 315. The second port of the summing junction 315 is connected to the output of the first attenuator 305. The input of attenuator 305 is connected to the coupled port of the second coupler 220.

Figure 1:
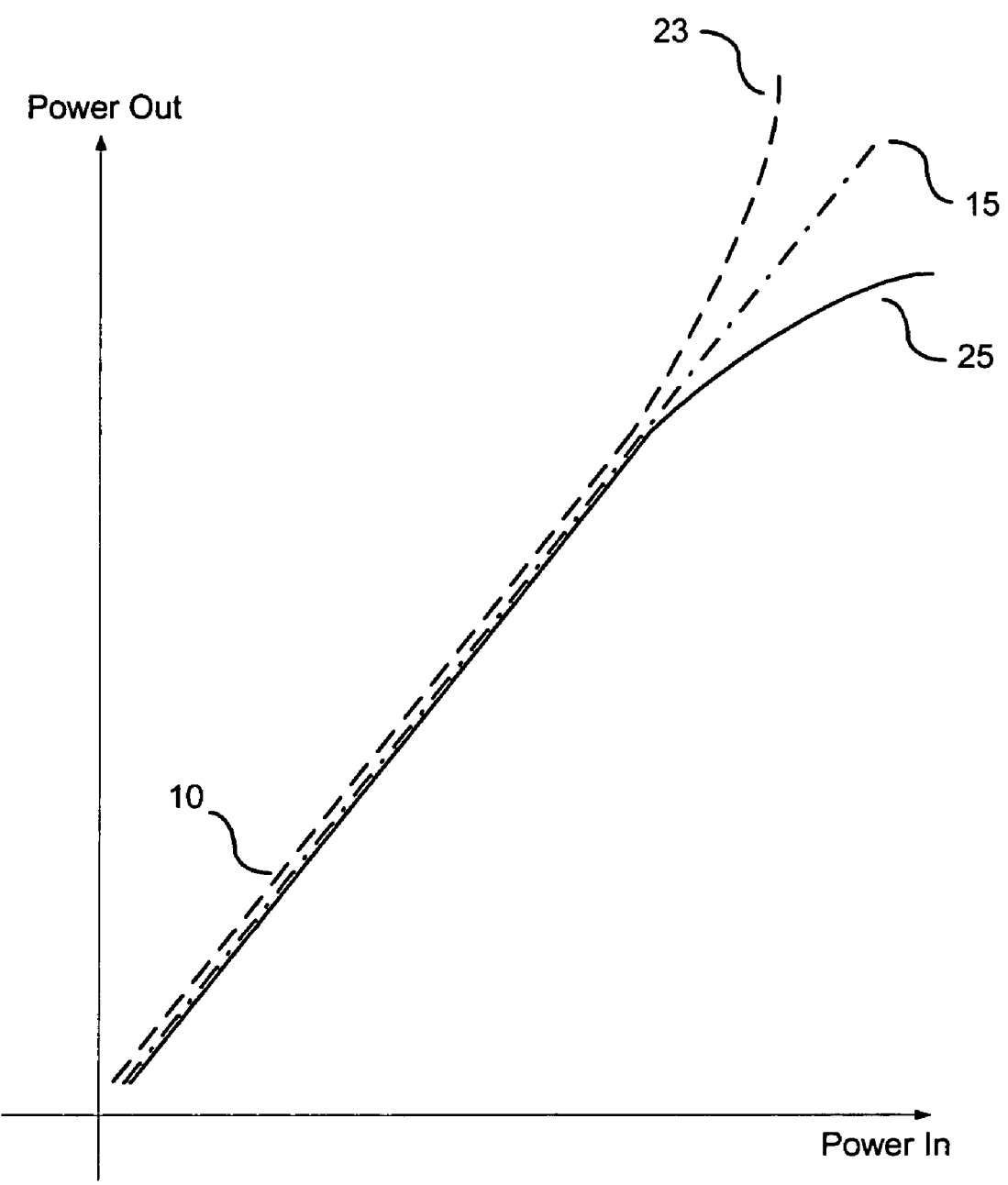
FIG. 1 is a drawing of typical power transfer curves in a prior art RF power amplifier.
Figure 2:
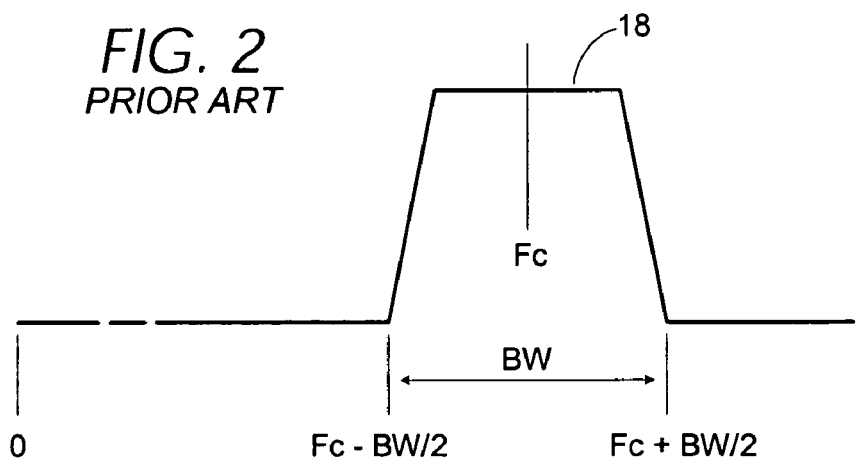
FIG. 2 is a drawing of typical channel bandwidth allocation in a prior art RF power amplifier.
Figure 3:
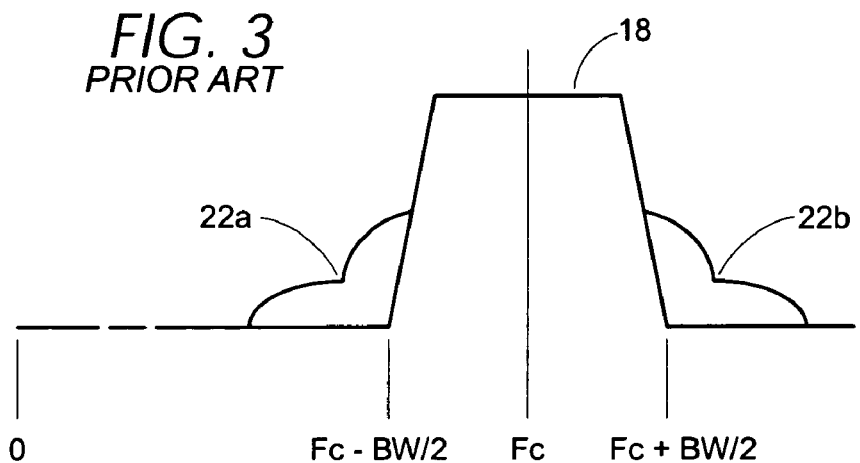
FIG. 3 is a drawing of typical IMD distortion due to use of a class A/B amplifier in a prior art RF power amplifier.
Figure 4:
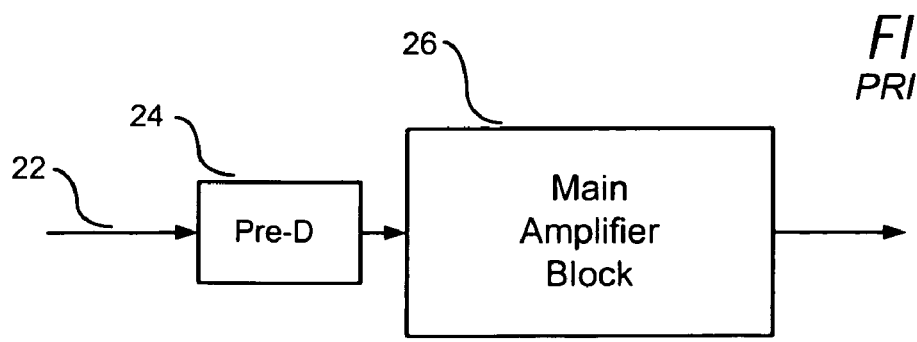
FIG. 4 is a block schematic drawing of a prior art amplifier employing predistortion.
Figure 5:
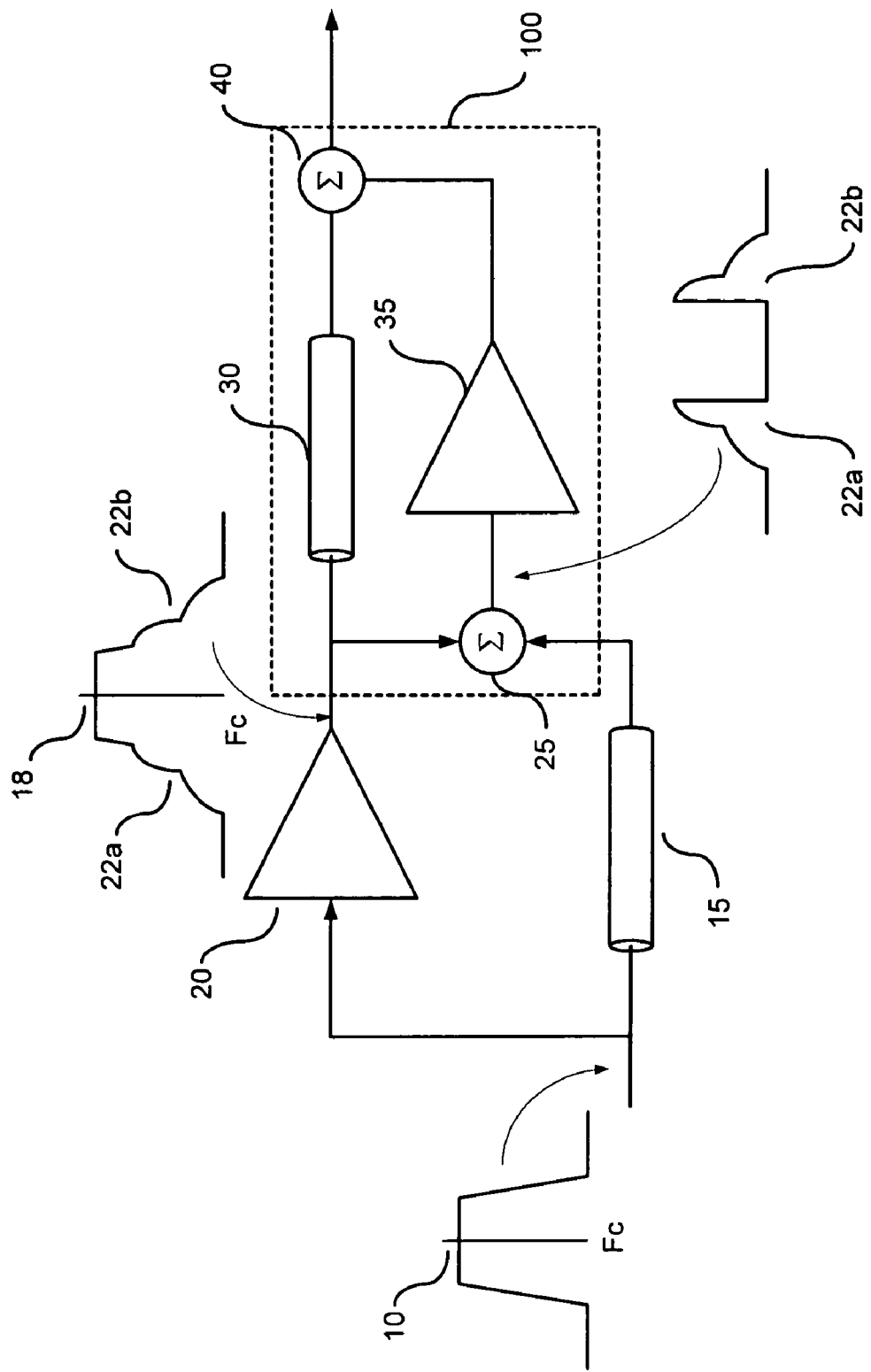
FIG. 5 is a block schematic drawing of a basic prior art feed forward amplifier.
Figure 6:
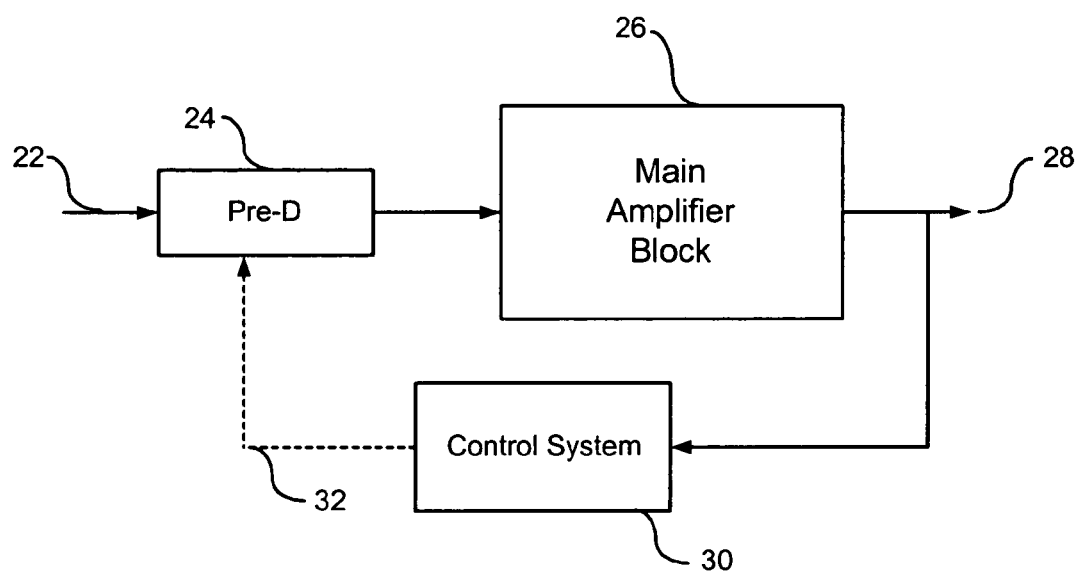
FIG. 6 is a block schematic drawing of a predistortion control system in a prior art amplifier employing predistortion.

Loop 1 is formed when the delayed input signal is summed with the sampled main amplifier output signal. Moreover, the active portion of Loop 1 is formed with first coupler 105, first gain and phase adjusting network 205, predistortion circuit 210, main amplifier 215, main amplifier output sampling coupler 220 and first attenuator 305. A passive portion of Loop 1 comprises first coupler 105, first delay line 115 and third coupler 310. It is apparent to those skilled in the art that the two halves share common components: first directional coupler 105 which is used to route the required portion of the input signal to each half of Loop 1 and summing junction 315 which is used to combine the delayed input signal with the sample of the main amplifier 215 output. The output port of the summing junction 315 contains IMDs due to non-linearities in the main amplifier 210 transfer function and attenuated input carrier (22a & 22b; FIG. 5). Loop 1 cancellation is controlled by monitoring the power level of carrier cancelled signals at the output of the first summing junction 315. Specifically, a conventionally disposed directional coupler 320 is connected to the output of the first summing junction 315. The coupled port of coupler 320 is coupled to the input of the carrier cancellation detector 500. Carrier cancellation detector 500 provides an appropriate signal to the microcontroller 810. Microcontroller 810, in conjunction with other input signals, continuously adjusts control signals to the first gain and phase network 205 in order to minimize the amount of carrier power present at the output of the first summing junction 315. Under full carrier cancellation conditions only IMD signals (22a & 22b; FIG. 5) should be present at the input of the error amplifier block 400. However, it is also advantageous to be able to insert or subtract additional input carrier power through the error amplifier in some applications.

Figure 16:
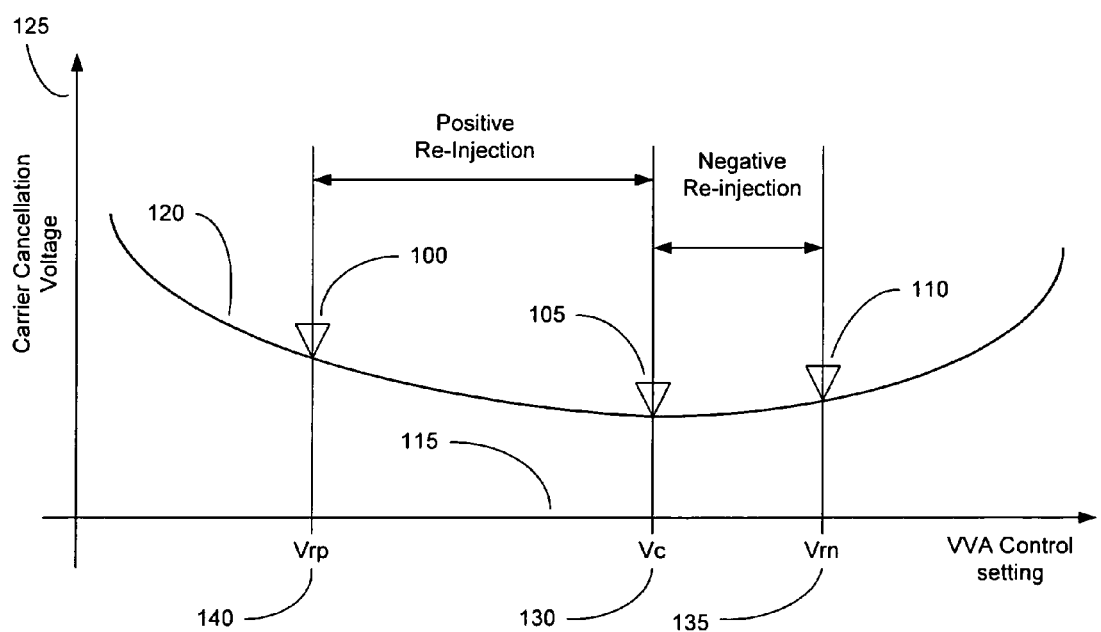
FIG. 16 is a drawing of a carrier re-injection curve.

FIG. 16 depicts a carrier cancellation detector voltage vs. loop 1 VVA control. Accordingly, a maximum carrier cancellation occurs at VVA setting 130 when the carrier cancellation detector detects minimum incident power 105. Under these conditions the resultant error signal (FIG. 5; 22a & 22b) contains mainly IMD's and very little of input carrier power. In most cases such a signal is very useful for IMD cancellation at the error injection coupler. However, use of such an error signal may not be optimum under certain operating conditions. If the input carrier signal is greater then the sampled output of the main amplifier the resultant composite signal will reduce peak to average ratio of such input signal. This is illustrated by VVA setting 140 and carrier power 100 offset from the minimum. Such composite input signal is termed to be a positive re-injection. This signal type increases average power levels in the error amplifier by having some carrier power present along with error signal. On a benefit side, such composite signal reduces the losses associated with the injection coupler by canceling carrier power dumped into a dump load of the injection from the main amplifier output. Conversely, a 180 degree out of phase carrier signal can be combined with the error signal at the input of the error amplifier. Such composite input signal might reduce peak signal levels present in the error amplifier path and could be defined as a negative re-injection. This is illustrated by VVA setting 135 and carrier power 110 offset in the opposite portion of the carrier power curve. Such negative re-injection reduces average power handling requirements on the error amplifier stages. This signal configuration does not yield any power loss compensation in the injection coupler dump load, but may be useful where the error amplifier can not handle high peak power levels. In both cases Loop 1 VVA control transfer function characteristics are known and the amount of desired compensation is controlled by a microprocessor algorithm.

Figure 13:
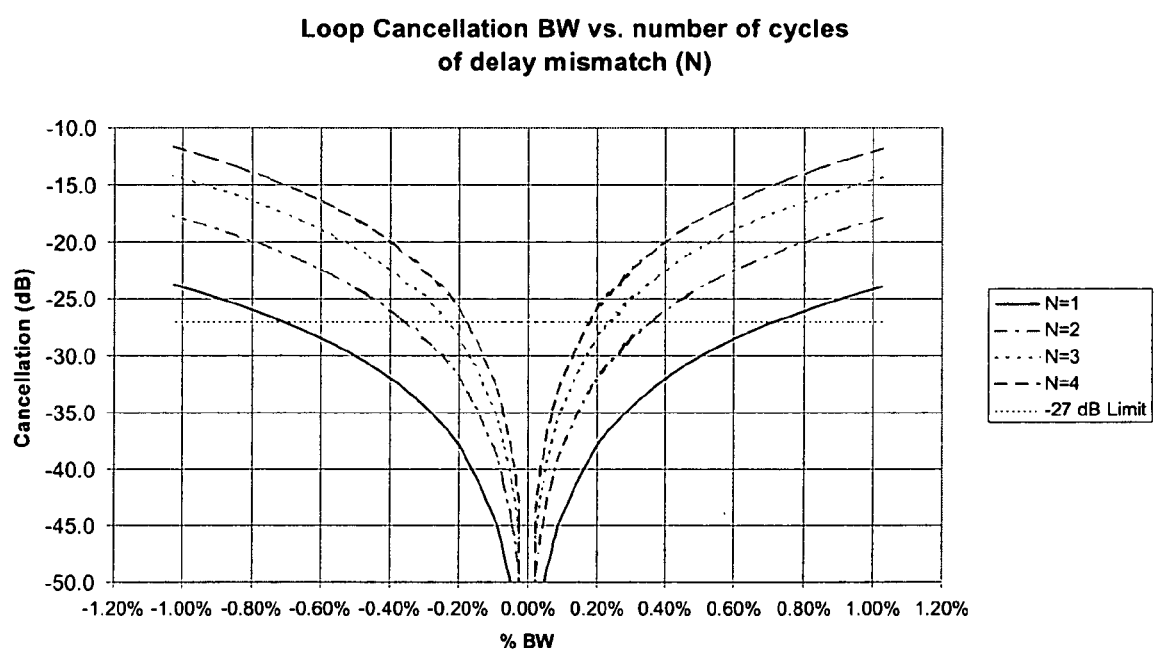
FIG. 13 is a drawing of narrow band loop cancellation bandwidth vs. number of cycles of delay mismatch illustrating delay mismatch employed in a preferred embodiment of the present invention.

Referring again to FIG. 7, Loop 2 is used to cancel IMDs present in the output of the main amplifier 215. Loop 2 is formed by the following circuit elements: second directional coupler 220, main delay line 225 and error injection coupler 230 which together constitute the passive portion of Loop 2. The active portion of Loop 2 contains second directional coupler 220, first attenuator 305, summing junction 315 acting as a carrier cancellation combiner, fourth directional coupler 320 which is used for carrier cancellation detection as described previously, second gain and phase adjusting network 325, error amplifier 400, and error injection coupler 230. As noted above, one aspect of the present invention is implementation and usage of a very short electrical delay line 225. In a conventional feed forward power amplifier the length of the delay line is selected in such manner as to achieve equal delay from the input port of the second directional coupler 220 through the active portion of the loop 2 vs. from the input port of second directional coupler 220 through the delay line 225 to the output port of the error injection coupler 230. Any delay mismatch in terms of number of wavelengths results in a narrow cancellation bandwidth. For example, if we assume that the input signal is a WCDMA (Wide Code Division Multiple Access) signal with occupied bandwidth of 5 MHz, while operating at 2140 MHz we would consider instantaneous cancellation bandwidth of 25 MHz, i.e. 10 MHz above and below the WCDMA carrier. Referring to FIG. 13 we can determine the amount of cancellation afforded by the amount of delay mismatch cycles, N, between each half of Loop 2. In the present invention the delay provided by delay line 225 is less than the error path delay with a mismatch of N>3 cycles. As one example, for an error path delay of about 10 ns the delay provided by delay 225 would be about 1 to 1.5 ns in contrast to 10 ns for a conventional design. More generally, for a typical error path delay of about 10–20 ns the present invention will provide a delay in delay line 225 of less than 3 ns. Stated differently, the delay mismatch is such that the delay line is less than about 30% of the error path delay. Use of predistortion circuits in the main amplifier path provides additional advantages as it offers reduction in IMD levels found in the output of the main amplifier 215. Predistortion causes main amplifier 215 to be linearized, thus reducing instantaneous cancellation requirements from loop 2 due to reduction in IMD 22a & 22b levels in the output of the main amplifier 215.

Wide bandwidth cancellation is advantageous in feed forward power amplifiers designed for operation with wide input signals or multiple carriers with significant frequency separation between such carriers. Although a wideband solution is universally useful, when a single CDMA carrier is present a wideband feed forward power amplifier solution is not optimum due to the relatively low efficiency and high cost involved. Thus for a single carrier or a narrow bandwidth signal application the approach of the present invention is more advantageous. In narrow band applications instantaneous cancellation bandwidth is relatively small compared to that offered by broadband solutions. Thus, a delay mismatch penalty between the two portions of Loop 2 can be afforded without sacrificing cancellation ability of Loop 2 over the required cancellation bandwidth. Given these factors, a narrow input signal and instantaneous cancellation bandwidth requirements placed on Loop 2, together, reduce power-handling requirements on the error amplifier 400. The disclosed feed forward power amplifier architecture therefore utilizes a smaller error amplifier 400 than otherwise found in broadband feed forward power amplifier solutions. Typically, a broadband solution would utilize an error amplifier 400, which is a quarter of the main amplifier 215. One aspect of the present invention is higher efficiency afforded by the use of a smaller error amplifier 400, which can be about one tenth of the main amplifier 215. A smaller amplifier is also less costly to implement and easier to align in manufacturing.

Next Loop 3 of the feed forward power amplifier of the present invention will be described. Loop 3 comprises a second carrier cancellation combiner 260 and is formed between the input and output of the feed forward power amplifier system. One of the aspects of the present invention is to provide a carrier-reduced sample of the feed forward power amplifier output to the input of the spurious signal detector (or receiver) 805. The output signal is sampled by a fifth directional coupler 235 with its input port connected to the output port of the error injection coupler 230. Accordingly, the sample port of the fifth directional coupler 235 delivers a sample of amplified signal and remaining IMDs (which were not fully cancelled by the loop 2 operation) generated by a non-linear transfer function of the main amplifier 215 to the input port of the third delay line 250. The output port of the third delay line is connected to the input port of the third gain and phase adjustment network 255. The output port of the third gain and phase adjustment network 255 is connected to the first input port of the second summing junction (second carrier cancellation combiner) 260. The passive portion of loop 3 incorporates passive portions of loop 1: first directional coupler 105 and first delay line 115, and the input signal is provided by a third directional coupler or input sampling coupler 310. The coupled port of the third directional coupler 310 is connected to the input port of the fourth delay line 330. The output port of the fourth delay line 330 is connected to the second input port of the second summing junction 260. The output port of the second summing junction 260 is connected to the input port of the spurious signal receiver 805.

Loop 3 functions to reduce the amount of carrier power relative to IMD levels present at the input of the spurious signal receiver 805. More specifically, delay line 250 and delay line 330 provide a signal delay equalization of the sampled input carrier signals and the sampled main amplifier output signals so as to match the delays to allow carrier cancellation at combiner 260. Gain and phase adjustment circuit 255 provides an amplitude equalization of the sampled output signals from output coupler 235 to the amplitude of the sampled input carrier signals from coupler 310 and a phase adjustment to provide anti-phase addition of the sampled output signals and sampled input carrier signals at combiner 260. As a result the signal output from combiner 260 corresponds to the sampled output signal with a substantially reduced carrier component. This reduced carrier sampled output signal is provided as an input signal to the spurious signal detector 805.

Figure 10:
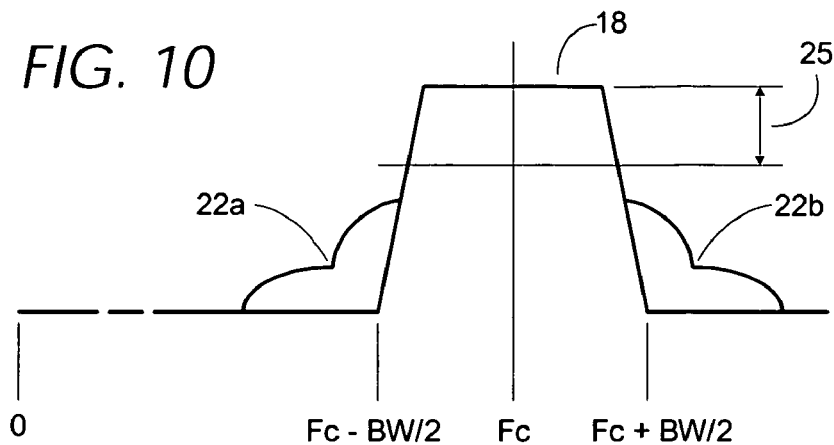
FIG. 10 is a drawing of the output spectrum of the feed forward amplifier system.
Figure 11:
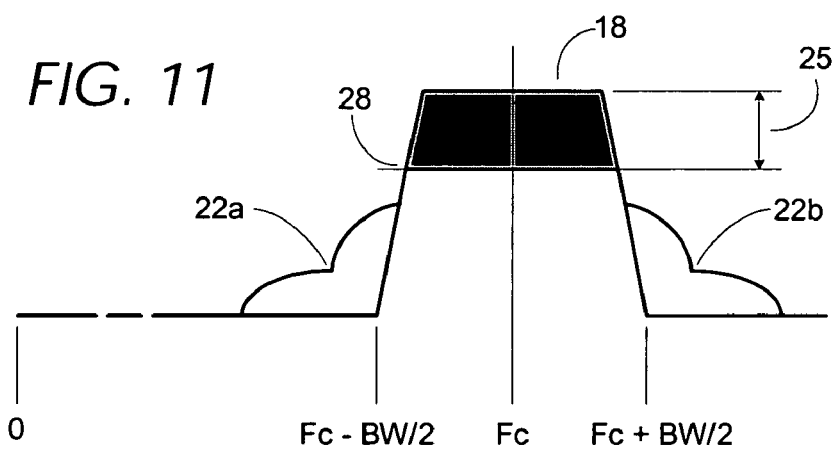
FIG. 11 is a drawing illustrating carrier reduction in the output spectrum of the feed forward amplifier system in accordance with a preferred embodiment of the present invention.
Figure 12:
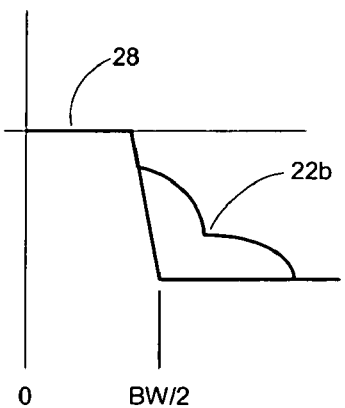
FIG. 12 is a drawing of an IF signal illustrating carrier reduction in the output spectrum of the feed forward amplifier system in accordance with a preferred embodiment of the present invention.

FIGS. 10 and 11 illustrate how the sampled output signal carrier level 18 can be substantially reduced to a lower level 28 by the above described Loop 3 operation. For example, a carrier level reduction of 15 to 20 dB may be provided (FIG. 11; 25). Reduced carrier power extends the useful dynamic range of the spurious receiver. Thus lower cost circuit components can be used in the spurious signal receiver operating on reduced power down converted IF (Intermediate Frequency) signals in order to achieve similar receiver performance. Such a down converted reduced power IF signal is shown in FIG. 12.

Figure 8:
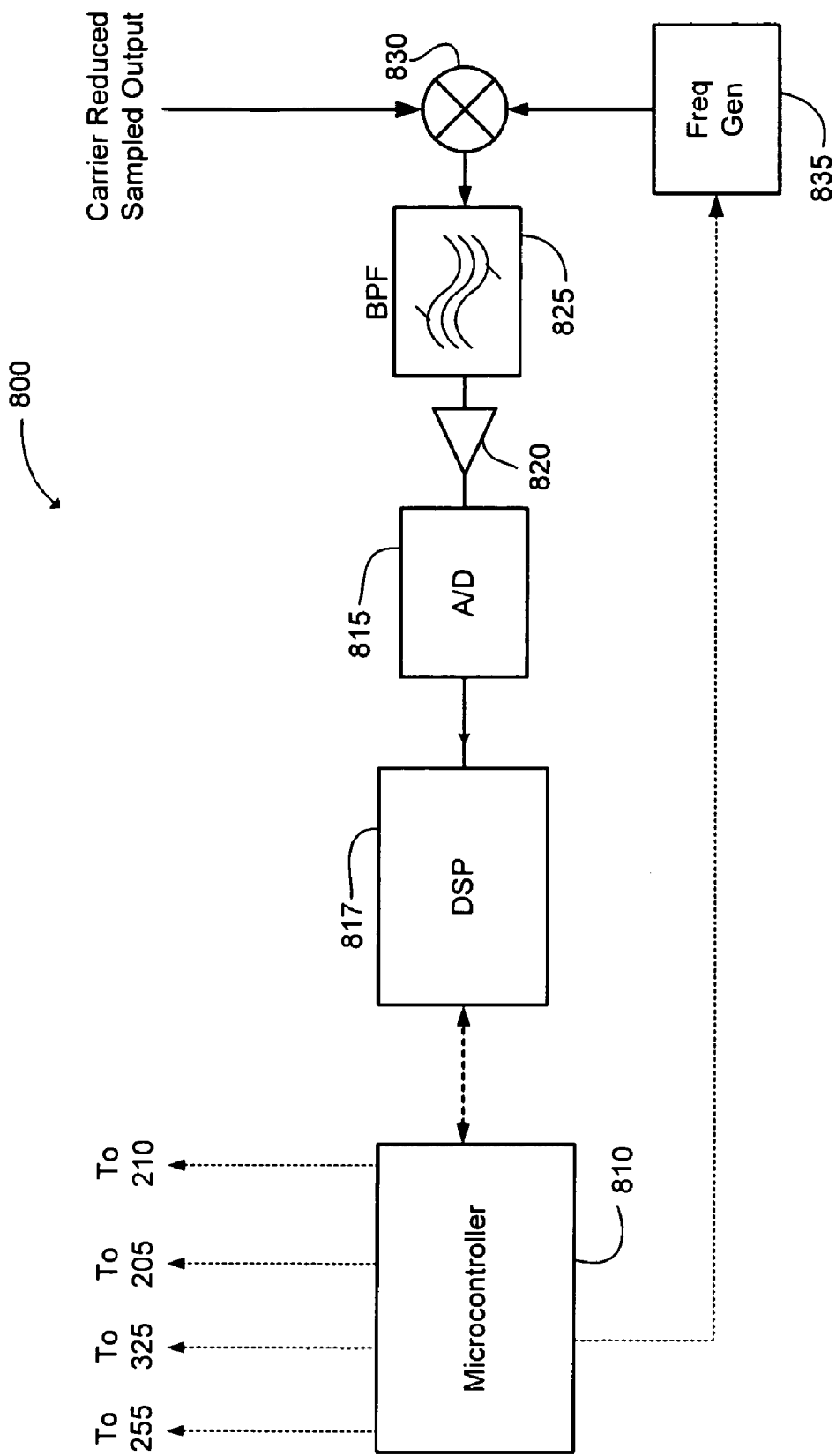
FIG. 8 is a drawing of a spurious detection loop control circuit in accordance with a preferred embodiment of the present invention.

Referring to FIG. 8 a detailed embodiment of the control system 800 is disclosed. As shown the control system includes microcontroller 810 and a spurious signal detector comprising down conversion mixer 830, a frequency generator 835 (which may comprise a suitable local oscillator) which provides a variable frequency signal (with frequency controllable by microcontroller 810) to mixer 830, band-pass filter 825, a small gain amplification stage 820, A/D converter 815, and digital signal processor 817. The microcontroller 810 adjusts the frequency of the frequency generator 835 and the DSP 817 measures signal power at different frequencies to locate the center frequency of the carrier bandwidth. Once the carrier band is located the out-of-band distortion products (22a, 22b; FIGS. 11 and 12) may be identified and such IMDs monitored to control the amplifier to minimize IMDs. In particular, the output of the spurious signal detector is used by microcontroller 810 to control IMD cancellation action of Loop 2 and (optionally) control pre-distorter 210 in Loop 1. In U.S. Pat. No. 6,140,874 to French et al., incorporated herein by reference, a control system utilizing a spurious signal detector is disclosed in detail and the operation of the control system and spurious signal detector of FIG. 8 may employ such teachings, which accordingly will not be described in detail herein. Due to the reduced carrier components of the sampled output signal, as shown in FIGS. 11 and 12, however, the circuit components of the spurious signal receiver of FIG. 8 may employ circuit components with less dynamic range and hence a more inexpensive spurious signal detector may be provided.

Figure 9:
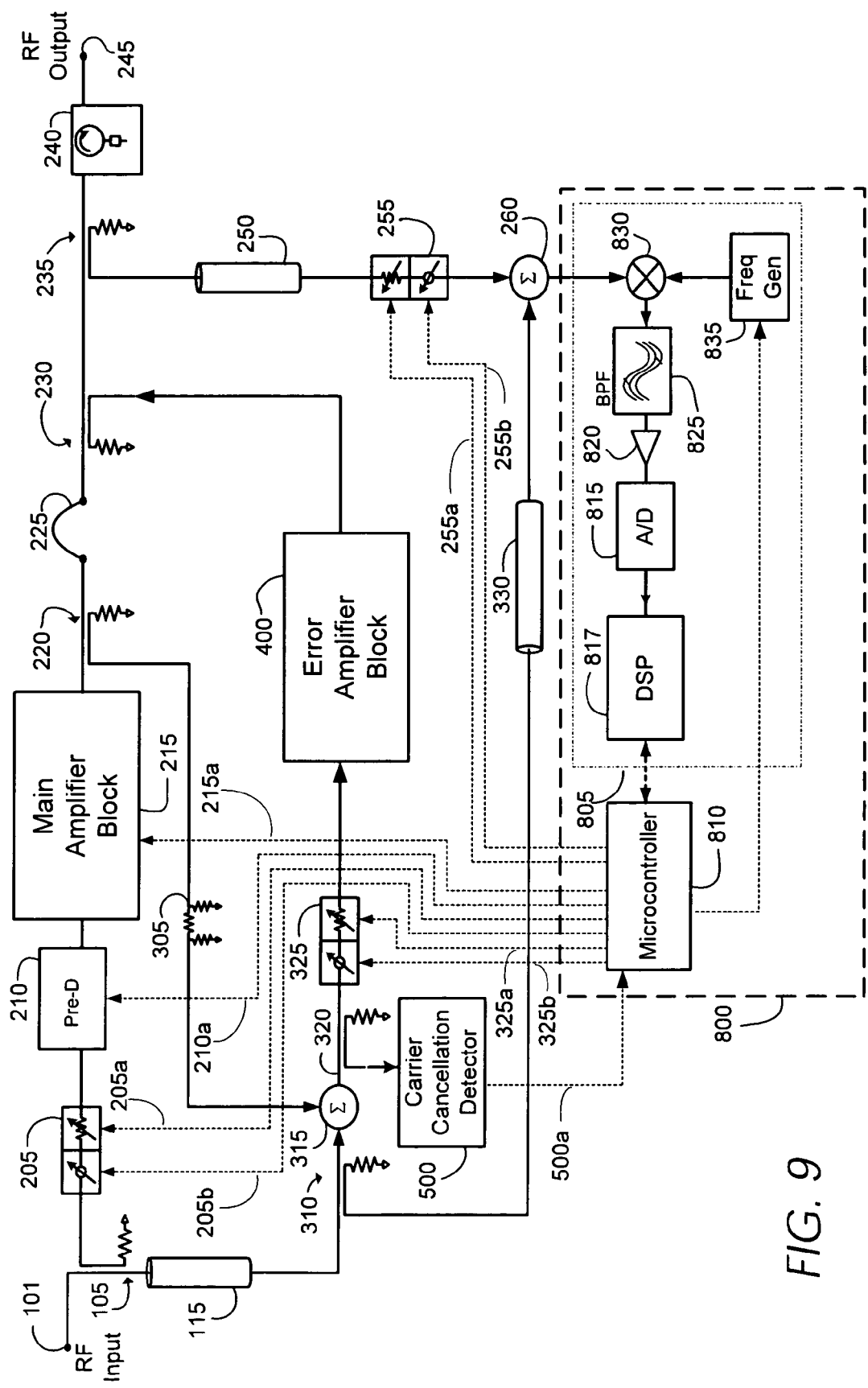
FIG. 9 is a drawing of a detailed embodiment of the feed forward amplifier system in accordance with a preferred embodiment of the present invention.

The detailed implementation of Loop 3 and the control system in the feed forward architecture is illustrated in FIG. 9. As described above the third signal cancellation loop—Loop 3 is utilized to reduce the carrier level of the signals present at the sample port 235 at the output of the amplifier. The microcontroller 810 controls this function along with the control of Loop 1 carrier cancellation and Loop 2 error (IMD) cancellation. More specifically, during Loop 3 control microcontroller 810 first sets the frequency of local oscillator 835 to a predetermined initial frequency. The IF output of mixer 830 is then band-pass filtered by filter 825 and converted to a digital signal by A/D converter 815. DSP 817 measures the energy at the intermediate frequency. DSP 817, for example, can frequency scan and integrate power in the IF. Microcontroller 810 iteratively adjusts the gain and phase adjustment circuit 255, and determines whether the energy measured at the intermediate frequency by DSP 817 does or does not exceed a desired intermediate frequency threshold level. Iterative adjustments of the gain and phase adjustment circuit 255 by microcontroller 810 will allow desired third loop carrier cancellation at combiner 260 by monitoring IF power level to achieve a desired reduction 25 (referring to FIG. 10) in carrier power. With Loop 3 controlled to a desired reduced carrier level the methods described in U.S. Pat. No. 6,140,874 may be employed for Loop 1 and Loop 2 control. More specifically, the frequency of the RF carrier (e.g., CDMA carrier) can be determined by varying the frequency of local oscillator 835. Once carrier frequency has been established a spectrum analyzer like processing is used in DSP 817 to measure the level of IMD products present at the output of the feed forward amplifier system. These measured IMD levels may be used by microcontroller 810 to control Loop 2 to minimize IMD levels (22a–22b, FIG. 10) at the output of the amplifier system. These measured IMD levels may also be used by microcontroller 810 to control predistorter 210 in Loop 1 to minimize IMDs which are created by the nonlinear operation of main amplifier 215.

To summarize, Loop 3 carrier level reduction allows for a reduction in dynamic range requirements placed on DSP and IF chain components of the control system. This aspect of the present invention allows for a faster conversion time in Loop 2 cancellation and enhanced cancellation of IMD products due to a greater useful dynamic range available for DSP 817.

The present invention has been described in relation to a presently preferred embodiment, however, it will be appreciated by those skilled in the art that a variety of modifications, too numerous to describe, may be made while remaining within the scope of the present invention. Accordingly, the above detailed description should be viewed as illustrative only and not limiting in nature.

What is claimed is:

1. A feed forward amplifier, comprising:
   an input for receiving an RF signal;
   a main amplifier receiving and amplifying said RF signal;
   a main amplifier output sampling coupler;
   a first delay coupled to the input and providing a delayed RF signal;
   a carrier cancellation combiner coupling the delayed RF signal from the first delay and to the output of the output sampling coupler;
   an error amplifier receiving and amplifying the output signal of the carrier cancellation combiner;
   a second delay coupled to the output of the main amplifier;
   an error coupler combining the output of the error amplifier and a delayed main amplifier output from the second delay so as to cancel distortion introduced by the main amplifier;
   an output sampling coupler coupled to the output of the error coupler and providing a sampled output signal;
   a carrier signal reduction circuit coupled to the output sampling coupler and providing a reduced carrier sampled output signal with a reduced carrier component; and
   a spurious signal detector coupled to the carrier signal reduction circuit, comprising a variable frequency down converter and a digital signal processor, for detecting out of band distortion in the reduced carrier sampled output signal;
   wherein the error amplifier has an inherent third delay associated with a signal path and wherein said second delay is substantially less than said third delay.

2. A feed forward amplifier as set out in claim 1, further comprising a controller, coupled to the spurious signal detector, for controlling the feed forward amplifier to minimize distortion detected by the spurious signal detector.

3. A feed forward amplifier as set out in claim 2, further comprising a gain adjuster and phase adjuster coupled between the carrier cancellation combiner and the error amplifier, wherein the controller controls the gain adjuster and phase adjuster to minimize the distortion detected by the spurious signal detector.

4. A feed forward amplifier as set out in claim 2, further comprising a gain adjuster and phase adjuster coupled between the input and the main amplifier, wherein the controller controls the gain adjuster and phase adjuster to minimize the output signal of the carrier cancellation combiner.

5. A feed forward amplifier as set out in claim 2, further comprising a predistorter coupled between the input and the main amplifier, wherein the controller controls the predistorter to minimize the distortion detected by the spurious signal detector.

6. A feed forward amplifier as set out in claim 1, wherein said error amplifier is substantially smaller than said main amplifier.

7. A feed forward amplifier as set out in claim 6, wherein said error amplifier is about one tenth the size of said main amplifier.

8. A feed forward amplifier as set out in claim 1, wherein the reduced carrier sampled output signal provided by said carrier signal reduction circuit has a carrier component about 15–20 dB less than the sampled output signal provided by said output sampling coupler.

9. A feed forward amplifier as set out in claim 2, wherein said variable frequency down converter comprises a variable frequency signal generator controlled by said controller and a mixer coupled to receive the variable frequency signal and the reduced carrier sampled output signal, for converting the frequency of the reduced carrier sampled output signal to a lower frequency signal.

10. A feed forward amplifier as set out in claim 9, wherein said spurious signal detector further comprises a bandpass filter coupled to the output of the down converter and wherein said digital signal processor is coupled to the output of the bandpass filter.

11. A feed forward amplifier as set out in claim 10, wherein said spurious signal detector further comprises an analog to digital converter coupled between the bandpass filter and the digital signal processor.

12. A feed forward amplifier, comprising:
    an input for receiving an RF signal;
    a main amplifier receiving and amplifying said RF signal;
    a main amplifier output sampling coupler;
    a first delay coupled to the input and providing a delayed RF signal;
    a carrier cancellation combiner coupling the delayed RF signal from the first delay and to the output of the output sampling coupler;
    an error amplifier receiving and amplifying the output signal of the carrier cancellation combiner;
    a second delay coupled to the output of the main amplifier;
    an error coupler combining the output the error amplifier and a delayed main amplifier output from the second delay so as to cancel distortion introduced by the main amplifier;
    an output sampling coupler coupled to the output of the error coupler and providing a sampled output signal;
    a carrier signal reduction circuit coupled to the output sampling coupler and providing a reduced carrier sampled output signal with a reduced carrier component, wherein said carrier signal reduction circuit further comprises an input sampling coupler configured between the first delay and the carrier cancellation combiner for sampling the input RF signal and a second carrier cancellation combiner for combining the sampled output signal and the sampled input RF signal to cancel a carrier component in said sampled output signal; and
    a spurious signal detector coupled to the carrier signal reduction circuit, comprising a variable frequency down converter and a digital signal processor, for detecting out of band distortion in the reduced carrier sampled output signal.

13. A feed forward amplifier as set out in claim 12, wherein said carrier signal reduction circuit further comprises an input delay between said input sampling coupler and said second carrier cancellation combiner and an output delay between said output sampling coupler and said second carrier cancellation combiner.

14. A feed forward amplifier as set out in claim 13, wherein said carrier signal reduction circuit further comprises a gain adjuster and phase adjuster coupled between said output sampling coupler and said second carrier cancellation combiner, and wherein the controller controls said gain and phase adjuster to minimize the carrier component of the sampled output signal.

15. A delay mismatched feed forward amplifier, comprising:
    an input for receiving an RE input signal;
    a first control loop coupled to the input and comprising a main amplifier, a main amplifier output sampling coupler, a delay element, and a first carrier cancellation combiner;
    a second control loop coupled to the first control loop and comprising a first signal path receiving the output of the main amplifier, a second signal path comprising an error amplifier receiving the output of the first carrier cancellation combiner, and an error injection coupler coupling the first and second signal paths, said first and second signal paths having a delay mismatch wherein said first signal path has substantially less delay than said second signal path;
    an output coupled to the error injection coupler for providing an output signal;
    a third control loop coupled between the input and the output and comprising a first coupler for sampling the input signal, a second coupler for sampling the output, and a second carrier cancellation combiner;
    a distortion detector coupled to the output signal of the second carrier cancellation combiner, said distortion detector comprising a digital signal processor performing a signal analysis on the output of the second carrier cancellation combiner; and
    a controller, coupled to the distortion detector, for controlling at least one of the first and second control loops to minimize distortion detected by the distortion detector.

16. A feed forward amplifier as set out in claim 15, wherein said delay mismatch between said first and second signal paths is greater than 3 cycles of the RF input signal.

17. A feed forward amplifier as set out in claim 15, wherein the delay of the second signal path is about 10–20 ns. and the delay of the first signal path is less than about 3 ns.

18. A feed forward amplifier as set out in claim 17, wherein the delay of the second path is about 10 ns. and wherein the delay of the first signal path is about 1.0–1.5 ns.

19. A feed forward amplifier as set out in claim 15, wherein the delay of the first signal path is about 30 percent or less of the delay of the second signal path.

20. A feed forward amplifier as set out in claim 15, wherein said third control loop further comprises:
    delay means for providing a signal delay equalization of said sampled input signal and said sampled output signal; and
    gain and phase adjusting means for providing an amplitude equalization of said sampled output signal and said sampled input signal and an anti-phase addition of the sampled output signal and said sampled input signal at said second carrier cancellation combiner.

21. A feed forward amplifier as set out in claim 20, wherein the controller controls said gain and phase adjusting means to minimize the level of carrier components on the output of the second carrier cancellation combiner.

22. A feed forward amplifier as set out in claim 15, wherein said error amplifier is substantially smaller than said main amplifier.

23. A feed forward amplifier as set out in claim 22, wherein said error amplifier is about one tenth the size of the main amplifier.

24. A feed forward amplifier as set out in claim 15, wherein said RF input signal has a carrier bandwidth of about 5 MHz or less.

25. A feed forward amplifier as set out in claim 15, wherein the output of said second carrier cancellation combiner has a substantially lower power carrier component than the output signal sampled by said second coupler.

26. A feed forward amplifier as set out in claim 25, wherein the output of said second carrier cancellation combiner has about 15–20 dB less power than the output signal sampled by said second coupler.

27. A method for amplifying an RF input signal employing feed forward compensation, comprising:
    receiving an RF input signal and providing said signal on a main signal path;
    sampling the RF input signal and providing the sampled RE input signal on a second signal path;
    amplifying the signal on said main signal path employing a main amplifier;
    sampling the main amplifier output;
    delaying the sampled RF input signal on the second signal path;
    coupling the delayed RF input signal to the sampled output from a main amplifier so as to cancel at least a portion of a carrier component of said sampled output from the main amplifier and provide a carrier canceled signal having a distortion component;
    amplifying the carrier canceled signal employing an error amplifier to provide an error signal;
    delaying the output of the main amplifier by a delay substantially less than the signal delay through the error amplifier;
    combining the error signal and the delayed output of the main amplifier so as to cancel distortion introduced by the main amplifier and providing an amplified RF output;
    sampling said amplified RF output;
    combining the sampled amplified RF output with an anti-phase sample of the input signal to provide a carrier reduced sampled output;
    down converting the carrier reduced sampled output using a variable frequency down converting signal; and
    detecting out-of-band distortion using a digital signal processor to analyze the spectrum of the down converted signal.

28. A method as set out in claim 27, further comprising adjusting the gain and phase of the carrier canceled signal input to said error amplifier to minimize the detected out-of-band distortion.

29. A method as set out in claim 27, further comprising adjusting the gain and phase of at least one of the sampled amplified RF output and sampled input signal to reduce the carrier component of the down converted signal to a desired level.

30. A method as set out in claim 27, wherein the signal delay through the error amplifier is greater than the signal delay of the output of the main amplifier by at least 3 cycles of the RF input signal.

31. A method as set out in claim 27, wherein the signal delay through the error amplifier is about 10–20 ns. and the signal delay of the output of the main amplifier is less than about 3 ns.

32. A method as set out in claim 31, wherein the signal delay through the error amplifier is about 10 ns. and the signal delay of the output of the main amplifier is less than about 1.5 ns.

33. A method as set out, in claim 27, wherein the signal delay of the output of the main amplifier is less than about 30 percent of the signal delay through the error amplifier.

34. A method as set out in claim 27, wherein said RF input signal has a carrier bandwidth of about 5 MHz or less.

* * * * *